(12) United States Patent
Gao et al.

(10) Patent No.: US 11,225,710 B2
(45) Date of Patent: Jan. 18, 2022

(54) METHOD FOR PREPARING SUPER-LUBRICATIVE MULTI-LAYER COMPOSITE FULLERENE-LIKE CARBON LAYER/GRAPHENE-LIKE BORON NITRIDE THIN FILM

(71) Applicant: LANZHOU INSTITUTE OF CHEMICAL PHYSICS, CHINESE ACADEMY OF SCIENCES, Gansu (CN)

(72) Inventors: Kaixiong Gao, Gansu (CN); Junyan Zhang, Gansu (CN); Bin Zhang, Gansu (CN); Yuanlie Yu, Gansu (CN); Li Qiang, Gansu (CN); Xingkai Zhang, Gansu (CN)

( * ) Notice: Subject to any disclaimer, the term of this patent is extended or adjusted under 35 U.S.C. 154(b) by 0 days.

(21) Appl. No.: 16/897,881

(22) Filed: Jun. 10, 2020

(65) Prior Publication Data
US 2020/0299828 A1 Sep. 24, 2020

Related U.S. Application Data

(63) Continuation of application No. PCT/CN2018/077979, filed on Mar. 5, 2018.

(51) Int. Cl.
*C23C 14/35* (2006.01)
*C23C 14/02* (2006.01)
(Continued)

(52) U.S. Cl.
CPC .......... *C23C 14/35* (2013.01); *C23C 14/021* (2013.01); *C23C 14/0605* (2013.01);
(Continued)

(58) Field of Classification Search
CPC ... C23C 14/35; C23C 14/021; C23C 14/0605; C23C 14/0647; C23C 14/24;
(Continued)

(56) References Cited

U.S. PATENT DOCUMENTS 4,978,437 A * 12/1990 Wirz .................. C23C 14/3407
204/192.23
5,192,578 A * 3/1993 Ramm ................. C23C 14/325
204/192.38
(Continued)

FOREIGN PATENT DOCUMENTS

CN 101469402 A * 7/2009
CN 101469402 A 7/2009
(Continued)

OTHER PUBLICATIONS

Janner A., Alternative approaches to onion-like icosahedral fullerenes, 2014, Acta Cryst., 70, 168-180 (Year: 2014).*
(Continued)

*Primary Examiner* — James Lin
*Assistant Examiner* — Patrick S Ott
(74) *Attorney, Agent, or Firm* — Bayramoglu Law Offices LLC

(57) ABSTRACT

A method for preparing a super-lubricative multi-layer composite fullerene-like carbon layer/graphene-like boron nitride thin film is provided. A substrate is ultrasonically cleaned in absolute ethyl alcohol and acetone sequentially for 15 min. The substrate is cleaned by argon plasma bombardment for 15 min. A fullerene-like carbon layer A having an onion-like structure is prepared by high-vacuum medium-frequency magnetron sputtering for 30 s. A graphene-like boron nitride layer B is prepared by high-vacuum medium-frequency magnetron sputtering and coating device to sputter the elemental boron target for 30 s. Steps (3) and (4) are repeated 80 times to overlay the fullerene-like carbon layer A and the graphene-like boron nitride layer B in an alternate way. The super-lubricative multi-layer composite fullerene-like carbon layer/graphene-like boron nitride thin (Continued)

film has a large load capacity, and excellent wear resistance, high temperature resistance and super lubrication.

7 Claims, 1 Drawing Sheet

(51) Int. Cl.
  *C23C 14/06*     (2006.01)
  *C23C 14/24*     (2006.01)
  *C23C 14/54*     (2006.01)
  *C23C 28/04*     (2006.01)

(52) U.S. Cl.
  CPC .......... *C23C 14/0647* (2013.01); *C23C 14/24* (2013.01); *C23C 14/542* (2013.01); *C23C 28/04* (2013.01)

(58) Field of Classification Search
  CPC ..... C23C 14/542; C23C 28/04; C23C 14/352; C23C 14/345; C23C 14/3414; C23C 14/022; C23C 28/044; C23C 28/40; C23C 28/42; C23C 28/042; C23C 14/0036; C10M 103/00; C10M 2201/041; C10M 2201/061; C10N 2050/025; C10N 2030/06; C01B 21/064; C01B 32/154
  See application file for complete search history.

(56) References Cited

U.S. PATENT DOCUMENTS

| | | | | |
|---|---|---|---|---|
| 5,392,981 | A * | 2/1995 | Makowiecki | C23C 14/3414<br>204/192.15 |
| 5,646,474 | A * | 7/1997 | Pryor | C23C 14/0647<br>313/309 |
| 5,759,725 | A * | 6/1998 | Hirao | B82Y 10/00<br>430/130 |
| 5,837,331 | A * | 11/1998 | Menu | C23C 16/342<br>427/569 |
| 5,858,538 | A * | 1/1999 | Wen | C09K 11/65<br>428/408 |
| 6,599,492 | B2 * | 7/2003 | Iwamura | C23C 14/0605<br>423/445 B |
| 8,163,634 | B2 * | 4/2012 | Garcia | H01L 21/02389<br>438/503 |
| 8,387,993 | B2 * | 3/2013 | Horton | F16J 15/3264<br>277/551 |
| 9,446,965 | B2 * | 9/2016 | Kverel | C01G 1/02 |
| 2008/0001141 | A1 * | 1/2008 | Gruner | H01B 1/24<br>257/40 |
| 2010/0108981 | A1 * | 5/2010 | Jayasekara | H01L 45/04<br>257/5 |
| 2011/0256386 | A1 * | 10/2011 | Shi | C30B 33/02<br>428/336 |
| 2013/0143063 | A1 * | 6/2013 | Cao | C23C 14/0036<br>428/623 |
| 2013/0306951 | A1 * | 11/2013 | Zhou | H01L 51/5215<br>257/40 |
| 2014/0145269 | A1 * | 5/2014 | Xiao | H01L 29/1606<br>257/366 |
| 2015/0167148 | A1 * | 6/2015 | Sutter | C23C 14/0647<br>428/213 |

FOREIGN PATENT DOCUMENTS

| | | | |
|---|---|---|---|
| CN | 101665942 | A | 3/2010 |
| CN | 102453913 | A | 5/2012 |
| CN | 102994947 | A | 3/2013 |
| CN | 103160781 | A | 6/2013 |
| CN | 104152849 | A | 11/2014 |
| CN | 105220120 | A | 1/2016 |
| CN | 105779950 | A * | 7/2016 |
| CN | 105779950 | A | 7/2016 |
| DE | 102016100725 | A1 | 7/2017 |

OTHER PUBLICATIONS

CN-101469402-A Translation (Year: 2009).*
CN-105779950-A Translation (Year: 2016).*
Zeiger, Marco. Review: carbon onions for electrochemical energy storage. 2016. J Mater. Chem. A, 4, p. 3172-3196 (Year: 2016).*
Wang, P., Wang, X., Zhang, B., & Liu, W. (2010). Structural, mechanical and tribological behavior of fullerene-like carbon film. Thin Solid Films, 518(21), 5938-5943.
Wang Xia, Wang Peng, Zhang Bin, Yang Shengrong, Zhang Junyan. (2008). A Tribological Behavior and Mechanism of a Fullerene-Like Carbon Film and Different Coupled Parts. Journal of Tribology, 28(4).

* cited by examiner

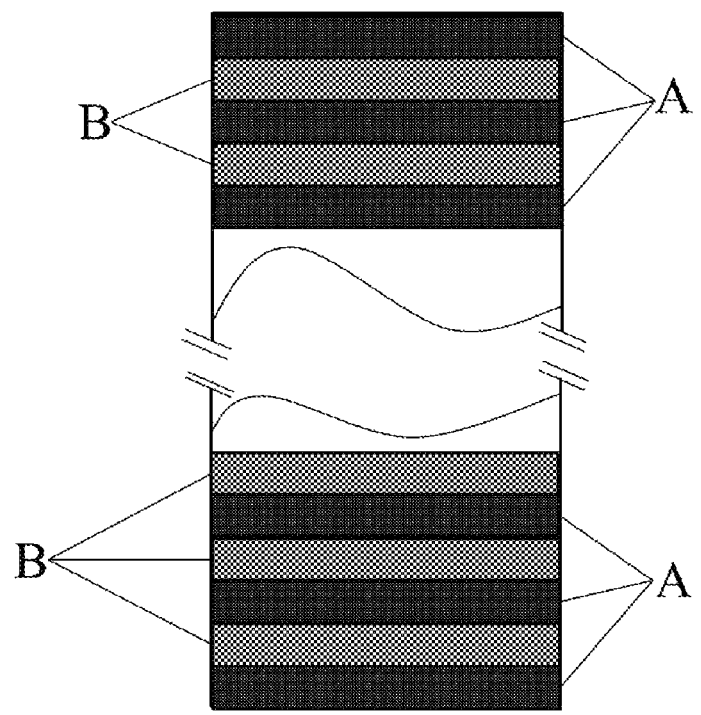

METHOD FOR PREPARING SUPER-LUBRICATIVE MULTI-LAYER COMPOSITE FULLERENE-LIKE CARBON LAYER/GRAPHENE-LIKE BORON NITRIDE THIN FILM

CROSS-REFERENCE TO RELATED APPLICATIONS

This application is a continuation of International Application No. PCT/CN2018/077979, filed on Mar. 5, 2018, which claims the benefit of priority from Chinese Patent Application No. 201711382569.9, filed on Dec. 20, 2017. The content of the aforementioned applications, including any intervening amendments thereto, is incorporated herein by reference.

TECHNICAL FIELD

This application relates to solid lubrication, and more particularly to a method for preparing a super-lubricative multi-layer composite fullerene-like carbon layer/graphene-like boron nitride thin film.

BACKGROUND OF THE INVENTION

Currently, thin film materials are widely used in various fields such as lubrication, computer science, cloud storage, sensor, precision motion mechanical engineering, microelectronic, aviation and nuclear industry. The thin film materials are further extended to a wider range of applications.

The thin film materials have been applied to lubrication for years. It has been disclosed that friction and abrasion mostly occur at the surface and sub-surface of the material. Therefore, it is key to improve the surface property of the material to improve the tribology performance of the material. A thin film formed on the surface of the material is able to effectively change the tribology performance to satisfy different operating requirements without changing the property of the material itself.

However, with the development of aviation, cloud storage, big data and flexible wearable devices, the requirements for lubrication film materials become stricter, especially for those served in extreme conditions, such as vacuum, alternation of high and low temperature, high speed and large load capacity. In order to provide the device with high reliability, high precision and long service life, there is an increasingly urgent demand for a novel lubrication film material with ultralow friction and adaptive to multiple conditions.

Due to the low friction coefficient, high hardness, good elastic recovery and fine wear resistance, the fullerene-like carbon film is an advanced solid lubrication material and is popular among scientific and industrial communities.

Hexagonal Boron nitride (h-BN) has a layered structure similar to graphite, and each layer includes many tabular hexagon units. The layers are bonded by van der Waals forces, resulting in an ultralow shear force between the layers. h-BN is very stable in the air that it can tolerate a high temperature of 2270 K and sublimates at 3270 K. Therefore, h-BN has a great potential to serve as a high-temperature lubrication material.

However, the thin film material has become multilayer, compound and gradient instead of single layer and component. The single film fails to satisfy the requirements of the extreme conditions and various devices to the high reliability, high precision and long service life. There is an urgent demand for a novel lubrication film material with excellent performance and adaptive to multiple conditions. The multilayer composite film will overcome the defects of the single film and learn from the advantages of the single film to obtain a high-quality film as required.

The multilayer composite film has been greatly concerned due to the advantages of super lubrication, low stress and wear resistance. The super lubrication refers to a situation that the friction between two contact surfaces becomes nearly zero and even disappears, with a friction coefficient that is less than 0.01. Therefore, by integrating respective advantages of two or more types of thin films, the multilayer composite film achieves the super-lubricative performance.

SUMMARY OF THE INVENTION

An object of this disclosure is to provide a method for preparing a super-lubricative multi-layer composite fullerene-like carbon layer/graphene-like boron nitride thin film.

This disclosure obtains a high-temperature super-lubricative composite thin film by integrating the large load capacity of fullerene-like carbon thin film and the low shear force of graphene-like boron nitride thin film under high temperature. The stratified structure of the fullerene-like carbon thin film and the graphene-like boron nitride thin film effectively weakens the residual stress and obviously improves the bonding force between the stratified structure and the substrate, overcoming the defect of the graphene-like boron nitride thin film generated by a high-density particle bombardment.

The disclosure provides a method for preparing a super-lubricative multi-layer composite fullerene-like carbon layer/graphene-like boron nitride thin film, comprising:

1) ultrasonically cleaning a substrate in absolute ethyl alcohol and acetone sequentially for 15-30 min;

2) cleaning the substrate by argon plasma bombardment for 15 min;

3) preparing a fullerene-like carbon layer A having an onion-like structure by high-vacuum medium-frequency magnetron sputtering;

4) preparing a graphene-like boron nitride layer B using a high-vacuum medium-frequency magnetron sputtering and coating device to sputter an elemental boron target;

5) repeating steps (3) and (4) 60-80 times to overlay the fullerene-like carbon layer A and the graphene-like boron nitride layer B in an alternate way to obtain the super-lubricative multi-layer composite fullerene-like carbon layer/graphene-like boron nitride thin film with a first layer and a last layer being the fullerene-like carbon layer A.

In some embodiments, the substrate is made of metal or ceramic.

In some embodiments, the fullerene-like carbon layer A has a thickness of 6-12 nm, the graphene-like boron nitride layer B has a thickness of 2.1-3.5 nm, and the super-lubricative multi-layer composite fullerene-like carbon layer/graphene-like boron nitride thin film has a total thickness of 2-3.5 μm.

In some embodiments, the fullerene-like carbon layer A is prepared by high-vacuum medium-frequency magnetron sputtering using methane or acetylene under a pressure of 10-15 Pa, a negative bias pulsed voltage of 800-1000 V and a duty ratio of 60%-80% for 10-50 s.

In some embodiments, the graphene-like boron nitride layer B is prepared using the high-vacuum medium-frequency magnetron sputtering and coating device to sputter the elemental boron target in an atmosphere of nitrogen and argon under a pressure of 0.4-0.5 Pa, a negative bias pulsed voltage of 400-1000 V and a duty ratio of 60%-80% for 10-50 s; wherein the nitrogen has a purity of more than 99.99% and a flow rate of 55-95 sccm; and the argon has a purity of more than 99.99% and a flow rate of 60-120 sccm.

In some embodiments, the elemental boron target is rectangle, circular or a rotary column.

In some embodiments, a purity of the elemental boron target is more than 99.9% and is produced by hot forming; the elemental boron target has a length of 60-90 cm, a width of 10-20 cm and a height of 1-5 cm.

In some embodiments, the super-lubricative multi-layer composite fullerene-like carbon layer/graphene-like boron nitride thin film is applicable to enhancing a wear resistance and reducing a friction coefficient of a surface of metal and ceramic materials under high temperature; the friction coefficient under high temperature and oxygen is within 0.004±0.002.

In some embodiments, the super-lubricative multi-layer composite fullerene-like carbon layer/graphene-like boron nitride thin film has a hardness of 20-36 GPa.

Compared with a single-layer fullerene-like carbon thin film and a single-layer graphene-like boron nitride thin film, the super-lubricative multi-layer composite fullerene-like carbon layer/graphene-like boron nitride thin film in this disclosure has a large load capacity, high temperature and oxidation resistances and super lubrication; the friction coefficient is 0.004; a wear rate is reduced by 70%; the high temperature resistance is improved to 600-2000° C.; the service life is prolonged by 2-3 times.

BRIEF DESCRIPTION OF THE DRAWINGS

The FIGURE is a sectional view of a super-lubricative multi-layer composite fullerene-like carbon layer/graphene-like boron nitride thin film according to the present disclosure, where A refers to a fullerene-like carbon layer and B refers to a graphene-like boron nitride layer.

DETAILED DESCRIPTION OF EMBODIMENTS

The disclosure will be further described with reference to the following embodiments and the accompany drawing.

Embodiment 1

The disclosure provides a method for preparing a super-lubricative multi-layer composite fullerene-like carbon layer/graphene-like boron nitride thin film, including the following steps.

1) A substrate is ultrasonically cleaned in absolute ethyl alcohol and acetone sequentially for 15 min, then is blown dry using nitrogen, and is placed in a chamber at a distance of 80 mm from a target. A vacuumizing is started. Specifically, the substrate can be a 304 stainless steel sheet.

2) When the pressure of the chamber is less than $5 \times 10^{-5}$ Pa, argon enters the chamber at a flow rate of 120 sccm, the bias pulsed voltage is −1000 V, and the duty ratio is 70%, the substrate is cleaned by argon plasma bombardment for 15 min to remove oxide and other materials on the surface of the substrate.

3) A first inflow valve for $CH_4$ is opened to let $CH_4$ in at a flow rate of 80 sccm; a second inflow valve for Ar is opened to let Ar in at a flow rate of 120 sccm; the pressure of the chamber is kept as 15 Pa; and the bias pulsed voltage is adjusted to −800 V. A fullerene-like carbon layer A is prepared by high-vacuum medium-frequency magnetron sputtering for 30 s.

4) The first inflow valve for $CH_4$ is closed; a third inflow valve for $N_2$ is opened to let $N_2$ in at a flow rate of 80 sccm; the second inflow valve for Ar is adjusted to let Ar in at a flow rate of 90 sccm; the pressure of the chamber is kept as 0.45 Pa; a baffle for an elemental boron target is opened; the elemental boron target is electrified to adjust the sputtering current to 1 A; the bias pulsed voltage is increased from −400 V to −600 V by −100 V every 5 s, and then keeps at −600 V for 10 s. A graphene-like boron nitride layer B is prepared using a high-vacuum medium-frequency magnetron sputtering and coating device to sputter the elemental boron target for 20 s.

5) Steps (3) and (4) are repeated 80 times to overlay the fullerene-like carbon layer A and the graphene-like boron nitride layer B in an alternate way, as shown in the FIGURE, to obtain the super-lubricative multi-layer composite fullerene-like carbon layer/graphene-like boron nitride thin film with a total thickness of 1.04 μm.

6) The super-lubricative multi-layer composite fullerene-like carbon layer/graphene-like boron nitride thin film has a hardness of 25 GPa, a bonding force of 60 GPa and a friction coefficient of 0.004.

A BASALT-N2 friction wear testing machine is used to test the performance of the super-lubricative multi-layer composite fullerene-like carbon layer/graphene-like boron nitride thin film in this embodiment. Table 1 indicated the conditions and results of a frictional wear experiment for the super-lubricative multi-layer composite fullerene-like carbon layer/graphene-like boron nitride thin film according to the present disclosure. As shown in Table 1, the test was carried out in a ball-disc reciprocating friction mode with a load of 20 N, a frequency of 5 Hz, a stroke of 5 mm, a temperature of 27° C. and a moisture content of 38%. The multilayer fullerene-like carbon layer/graphene-like boron nitride super-lubricative composite thin film is prepared on a stainless steel sheet, the dual balls are made of GCr15 bearing steel, and the dual balls have a diameter of 6 mm. The result showed that the friction coefficient was kept at 0.006, the wear rate was $3.4 \times 10^{-9}$ m$^3$/Nm.

TABLE 1

| | |
|---|---|
| Load | 20 N |
| Frequency | 5 Hz |
| Stroke | 5 mm |
| Temperature | 27° C. |
| Moisture % | 38% |
| Dual balls | GCr15 6 mm |
| Friction coefficient | 0.006 |
| Wear rate | $3.4 \times 10^{-9}$ m$^3$/Nm |

What is claimed is:

1. A method for preparing a lubricative multi-layer composite fullerene-like carbon layer/graphene-like boron nitride thin film, comprising:
   1) ultrasonically cleaning a substrate sequentially in absolute ethyl alcohol acetone;
   2) cleaning the substrate by argon plasma bombardment for 15 min;
   3) preparing a fullerene-like carbon layer A having an onion-like structure by high-vacuum medium-frequency magnetron sputtering;

4) preparing a graphene-like boron nitride layer B using a high-vacuum medium-frequency magnetron sputtering and coating device to sputter an elemental boron target;

5) repeating steps (3) and (4) 60-80 times to overlay the fullerene-like carbon layer A and the graphene-like boron nitride layer B in an alternate way to obtain the lubricative multi-layer composite fullerene-like carbon layer/graphene-like boron nitride thin film with a first layer and a last layer being the fullerene-like carbon layer A.

2. The method of claim 1, wherein the substrate is made of metal or ceramic.

3. The method of claim 1, wherein the fullerene-like carbon layer A has a thickness of 6-12 nm, the graphene-like boron nitride layer B has a thickness of 2.1-3.5 nm, and the multilayer fullerene-like carbon layer/graphene-like boron nitride lubricative composite thin film has a total thickness of 2-3.5 μm.

4. The method of claim 1, wherein the fullerene-like carbon layer A is prepared by high-vacuum medium-frequency magnetron sputtering using methane or acetylene under a pressure of 10-15 Pa, a negative bias pulsed voltage of 800-1000 V and a duty ratio of 60%-80% for 10-50 s.

5. The method of claim 1, wherein the graphene-like boron nitride layer B is prepared using the high-vacuum medium-frequency magnetron sputtering and coating device to sputter the elemental boron target in an atmosphere of nitrogen and argon under a pressure of 0.4-0.5 Pa, a negative bias pulsed voltage of 400-1000 V and a duty ratio of 60%-80% for 10-50 s; wherein the nitrogen has a purity of more than 99.99% and a flow rate of 55-95 sccm; and the argon has a purity of more than 99.99% and a flow rate of 60-120 sccm.

6. The method of claim 1, wherein the elemental boron target is rectangular, circular or a rotary column.

7. The preparation method of claim 1, wherein a purity of the elemental boron target is more than 99.9% and is produced by hot forming; and the elemental boron target has a length of 60-90 cm, a width of 10-20 cm and a height of 1-5 cm.

* * * * *